United States Patent
No et al.

(10) Patent No.: US 9,869,899 B2
(45) Date of Patent: Jan. 16, 2018

(54) DISPLAY DEVICE HAVING IMPROVED CONTROL FORCE OVER DIRECTERS OF LIQUID CRYSTALS

(71) Applicant: SAMSUNG DISPLAY CO., LTD., Yongin, Gyeonggi-Do (KR)

(72) Inventors: Sang Yong No, Seoul (KR); Sung Hoon Kim, Seoul (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 76 days.

(21) Appl. No.: 14/600,193

(22) Filed: Jan. 20, 2015

(65) Prior Publication Data
US 2015/0253640 A1  Sep. 10, 2015

(30) Foreign Application Priority Data
Mar. 4, 2014  (KR) .................... 10-2014-0025597

(51) Int. Cl.
| | |
|---|---|
| G02F 1/1333 | (2006.01) |
| G02F 1/1337 | (2006.01) |
| H01L 27/12 | (2006.01) |
| G02F 1/1362 | (2006.01) |
| G02F 1/1343 | (2006.01) |

(52) U.S. Cl.
CPC .... G02F 1/133707 (2013.01); *G02F 1/13624* (2013.01); *G02F 2001/134345* (2013.01); *G02F 2001/136222* (2013.01); *H01L 27/124* (2013.01)

(58) Field of Classification Search
CPC ... G02F 1/133707; G02F 2001/136222; G02F 2001/134345; G02F 1/13624; H01L 27/124
See application file for complete search history.

(56) References Cited

U.S. PATENT DOCUMENTS

| | | | |
|---|---|---|---|
| 8,203,687 B2 | 6/2012 | Choi et al. | |
| 2010/0060838 A1 | 3/2010 | Kim et al. | |
| 2011/0242443 A1 | 10/2011 | Choi et al. | |
| 2011/0242468 A1 | 10/2011 | Choi et al. | |
| 2012/0249940 A1 | 10/2012 | Choi et al. | |
| 2012/0306732 A1* | 12/2012 | Sugihara | G02F 1/134336 345/88 |
| 2013/0193461 A1 | 8/2013 | Kim et al. | |

FOREIGN PATENT DOCUMENTS

| | | |
|---|---|---|
| CN | 102213872 | 10/2011 |
| EP | 2372442 | 10/2011 |
| JP | 2007-249243 | 9/2007 |

(Continued)

*Primary Examiner* — Tracie Y Green
(74) *Attorney, Agent, or Firm* — F. Chau & Associates, LLC

(57) ABSTRACT

A display device includes pixels connected to gate lines and first and second data lines, dummy members extending in a first direction and disposed between adjacent pixels in a second direction crossing the first direction, and color filters extending in the second direction and overlapping pixels arranged in the second direction and disposed on the dummy members. A height of the color filters in step difference areas is larger than a height of the color filters in peripheral areas near the step difference areas. The step difference areas correspond to areas of the color filters in which the dummy members are disposed.

20 Claims, 8 Drawing Sheets

(56) References Cited

FOREIGN PATENT DOCUMENTS

| JP | 2011-221505 | 11/2011 |
| KR | 1020080099038 | 11/2008 |
| KR | 1020110111227 | 10/2011 |
| KR | 1020110117553 | 10/2011 |
| KR | 1020120083162 | 7/2012 |

* cited by examiner

DISPLAY DEVICE HAVING IMPROVED CONTROL FORCE OVER DIRECTERS OF LIQUID CRYSTALS

CROSS-REFERENCE TO RELATED APPLICATIONS

This application claims priority under 35 U.S.C. § 119 to Korean Patent Application No. 10-2014-0025597, filed on Mar. 4, 2014, the disclosure of which is incorporated by reference herein in its entirety.

TECHNICAL FIELD

Exemplary embodiments of the present disclosure relate to a display device. More particularly, exemplary embodiments of the present disclosure relate to a display device capable of improving a control force against directors of liquid crystals in the display device.

DISCUSSION OF THE RELATED ART

A liquid crystal display includes a first substrate, a second substrate facing the first substrate, and a liquid crystal layer disposed between the first and second substrates. Pixel electrodes are disposed on the first substrate to drive the liquid crystal layer and a common electrode is disposed on the second substrate.

An electric field is formed between the common electrode and the pixel electrodes by data voltages applied to the pixel electrodes and a common voltage applied to the common electrode. Due to the electric field formed between the common electrode and the pixel electrodes, liquid crystal molecules of the liquid crystal layer are realigned. An amount of light passing through the liquid crystal layer is controlled by the realigned liquid crystal molecules, and thus, desired images are displayed.

When external pressure and impact are applied to the liquid crystal display, the alignment of the liquid crystal molecules of the liquid crystal layer may be twisted in a different direction from a desired direction. When the twisted alignment of the liquid crystal molecules does not return to its normal position, an abnormal image may be displayed.

SUMMARY

Exemplary embodiments of the present disclosure provide a display device capable of improving a control force against directors of liquid crystals with respect to external pressure and impact applied to the display device.

An exemplary embodiment of the present disclosure provides a display device including a plurality of pixels connected to gate lines and first and second data lines, a plurality of dummy members extending in a first direction and disposed between the pixels adjacent to each other in a second direction crossing the first direction, and a plurality of color filters extending in the second direction and overlapping the pixels arranged in the second direction and disposed on the dummy members. A height of the color filters in step difference areas defined by areas of the color filters corresponding to areas in which the dummy members are disposed is larger than a height of the color filters in peripheral areas of the step difference areas.

In an exemplary embodiment, the dummy members include a same material as the gate lines, are substantially and simultaneously formed with the gate lines, and are disposed on a same layer as the gate lines.

In an exemplary embodiment, the display device further includes a first base substrate on which the dummy members are disposed and a first insulating layer disposed on the first base substrate and covering the dummy members. The color filters are disposed on the first insulating layer, the color filters disposed in the step difference areas have a first step difference defined by a difference in height between the color filters in the step difference areas and the color filters in the peripheral area, and the first step difference corresponds to a thickness of the dummy members.

In an exemplary embodiment, left and right boundary areas of the color filters in the step difference areas have an inclined surface such that a width between the left and right boundary areas of the color filters in the step difference areas gradually becomes narrower as a distance from an upper surface of the color filters decreases.

In an exemplary embodiment, the dummy members include a same material as, are substantially and simultaneously formed with, and are disposed on a same layer as the first and second data lines.

In an exemplary embodiment, the display device further includes a first base substrate and a first insulating layer disposed on the first base substrate. The dummy members are disposed on the first insulating layer, the color filters are disposed on the first insulating layer and cover the dummy members, the color filters are disposed on the first insulating layer, the color filters disposed in the step difference areas have a first step difference defined by a difference in height between the color filters in the step difference areas and the color filters in the peripheral areas, and the first step difference corresponds to a thickness of the dummy members.

In an exemplary embodiment, each of the dummy members includes a first dummy member including a same material as, substantially and simultaneously formed with, and disposed on a same layer as the gate lines, and a second dummy member having a same size as the first dummy member, overlapped with the first dummy member, including a same material as the first and second data lines, substantially and simultaneously formed with the first and second data lines, and disposed on a same layer as the first and second data lines.

In an exemplary embodiment, the display device further includes a first base substrate on which the first dummy member is disposed and a first insulating layer disposed on the first base substrate and covering the first dummy member. The second dummy member is disposed on the first insulating layer, each of the color filters is disposed on the first insulating layer and covers the second dummy member, the color filters disposed in the step difference areas have a second step difference defined by a difference in height between the color filters in the step difference areas and the color filters in the peripheral areas, and the second step difference corresponds to a sum of a thickness of the first dummy member and a thickness of the second dummy member.

In an exemplary embodiment, each of the pixels includes a first sub-pixel connected to a corresponding gate line of the gate lines and first and second data lines, and a second sub-pixel connected to the corresponding gate line and the second data line. The first sub-pixel includes a first transistor connected to the corresponding gate line and the first data line and a first pixel electrode connected to the first transistor. The second sub-pixel includes a second transistor connected to the corresponding gate line and the second data line and a second pixel electrode connected to the second transistor and disposed to be spaced apart from the first pixel electrode by a predetermined distance in the second direction. The first and second transistors are disposed between the first pixel electrode and the second pixel electrode in the second direction.

In an exemplary embodiment, a length in the first direction of each of the dummy members is smaller than a width between left and right sides of the first and second pixel electrodes, and a center portion of each of the dummy members is disposed to correspond to a center portion of the first and second pixel electrodes in the first direction.

In an exemplary embodiment, the first pixel electrode includes a first trunk portion having a cross shape, a plurality of first branch portions protruded and extending from the first trunk portion in a radial form, a first connection portion connecting the first trunk portion and the first branch portions in an upper boundary of the first pixel electrode, and a first connection electrode branched from two first branch portions disposed adjacent to a left side of a lower portion of the first trunk portion extending in the second direction, extending to make an acute angle with the first direction, and connected to the first transistor.

In an exemplary embodiment, the second pixel electrode includes a second trunk portion having a cross shape, a plurality of second branch portions protruded and extending from the second trunk portion in a radial form, a second connection portion connecting the second trunk portion and the second branch portions in a lower boundary of the second pixel electrode, a first extension portion branched from two second branch portions adjacent to a right side of an upper portion of the second trunk portion extending in the second direction and extending to make an acute angle with the first direction, a second extension portion connected to an upper portion of the first extension portion and extending upwardly, a third extension portion connected to an upper portion of the second extension portion and extending to make an obtuse angle with the first direction, a fourth extension portion connected to an upper portion of the third extension portion and extending upwardly, and a fifth extension portion connected to an upper portion of the fourth extension portion, extending to make an acute angle with the first direction, and connected to the second transistor. The second and third extension portions are disposed to partially overlap with the second transistor.

An exemplary embodiment of the present disclosure provides a display device including a plurality of pixels connected to a plurality of gate lines and a plurality of data lines, a dummy member extending in a first direction and disposed between adjacent pixels of the plurality of pixels in a second direction crossing the first direction, and a color filter extending in the second direction and overlapping pixels of the plurality of pixels arranged in the second direction and disposed on the dummy member. A height of the color filter in a step difference area is larger than a height of the color filter in a peripheral area near the step difference area. The step difference area corresponds to an area of the color filter in which the dummy member is disposed.

A display device according to the exemplary embodiments described above may improve the control force of directors of the liquid crystal molecules of the liquid crystal layer with respect to external pressure and impact applied to the display device.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EXEMPLARY EMBODIMENTS

Figure 1:
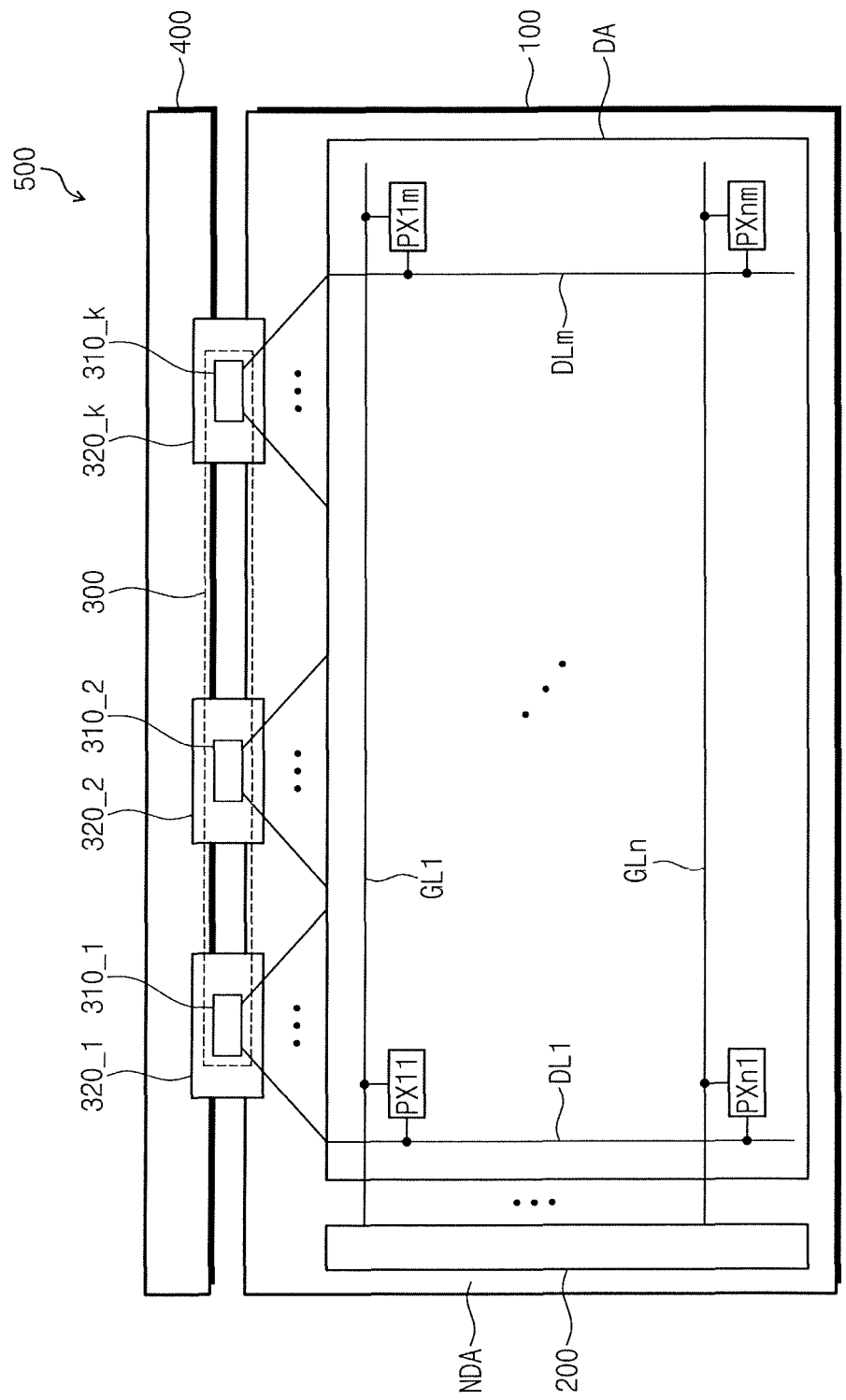
FIG. 1 is a plan view showing a display device according to an exemplary embodiment of the present disclosure.

Exemplary embodiments of the present disclosure will be described more fully hereinafter with reference to the accompanying drawings. Like reference numerals may refer to like elements throughout the accompanying drawings It will be understood that when an element or layer is referred to as being "on", "connected to" or "coupled to" another element or layer, it can be directly on, connected or coupled to the other element or layer or intervening elements or layers may be present.

It will be further understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

FIG. 1 is a plan view showing a display device according to an exemplary embodiment of the present disclosure.

Referring to FIG. 1, a display device 500 includes a display panel 100, a gate driver 200, a data driver 300, and a driving circuit board 400.

The display panel 100 includes a plurality of pixels PX11 to PXnm, a plurality of gate lines GL1 to GLn, and a plurality of data lines DL1 to DLm. The display panel 100 includes a display area DA and a non-display area NDA disposed adjacent to the display area DA when viewed in a plan view.

The pixels PX11 to PXnm are disposed in the display area DA and arranged in a matrix form. For example, the pixels PX11 to PXnm are arranged in n rows by m columns. Each of "m" and "n" is an integer greater than 0.

The gate lines GL1 to GLn are insulated from the data lines DL1 to DLm while crossing the data lines DL1 to DLm. The gate lines GL1 to GLn are connected to the gate driver 200 and sequentially receive gate signals from the gate driver 200. The data lines DL1 to DLm are connected to the data driver 300 and receive data voltages from the data driver 300.

Each of the pixels PX11 to PXnm is connected to a corresponding gate line of the gate lines GL1 to GLn and a corresponding data line of the data lines DL1 to DLm. The pixels PX11 to PXnm receive the data voltages through the data lines DL1 to DLm in response to the gate signals applied through the gate lines GL1 to GLn. The pixels PX11 to PXnm display gray scales corresponding to the data voltages.

The gate driver 200 generates the gate signals in response to a gate control signal applied from a timing controller, which may be mounted on the driving circuit board 400. The gate signals are sequentially applied to the pixels PX11 to PXnm through the gate lines GL1 to GLn in the unit of row. Thus, the pixels PX11 to PXnm are driven by row.

The gate driver 200 may be disposed in the non-display area NDA adjacent to a left side of the display area DA, as shown in FIG. 1. However, exemplary embodiments are not limited thereto. For example, the gate driver 200 may be disposed in other portions of the non-display area NDA. The gate driver 200 may disposed in the non-display area NDA in an amorphous silicon TFT gate driver circuit (ASG) manner, however, exemplary embodiments are not limited thereto. For example, the gate driver 200 may be mounted on the non-display area NDA in a chip on glass (COG) manner, or may be connected to the non-display area NDA in a tape carrier package (TCP) manner.

The data driver 300 receives image signals and a data control signal from the timing controller. The data driver 300 generates the data voltages, which correspond to the image signals, in response to the data control signal. The data driver 300 applies the data voltages to the pixels PX11 to PXnm through the data lines DL1 to DLm.

The data driver 300 includes a plurality of source driving chips 310_1 to 310_k, where k is an integer greater than 0 and less than m. Each of the source driving chips 310_1 to 310_k is mounted on a corresponding flexible circuit board from among a plurality of flexible circuit boards 320_1 to 320_k, and is connected between the driving circuit board 400 and the non-display area NDA adjacent to an upper portion of the display area DA. The data driver 300 may be connected to the display panel 100 in the tape carrier package (TCP) manner, however, exemplary embodiments are not limited thereto. The source driving chips 310_1 to 310_k may be mounted in the non-display area NDA disposed adjacent to the upper portion of the display area DA in the chip on glass (COG) manner, however, exemplary embodiments are not limited thereto.

Figure 2:
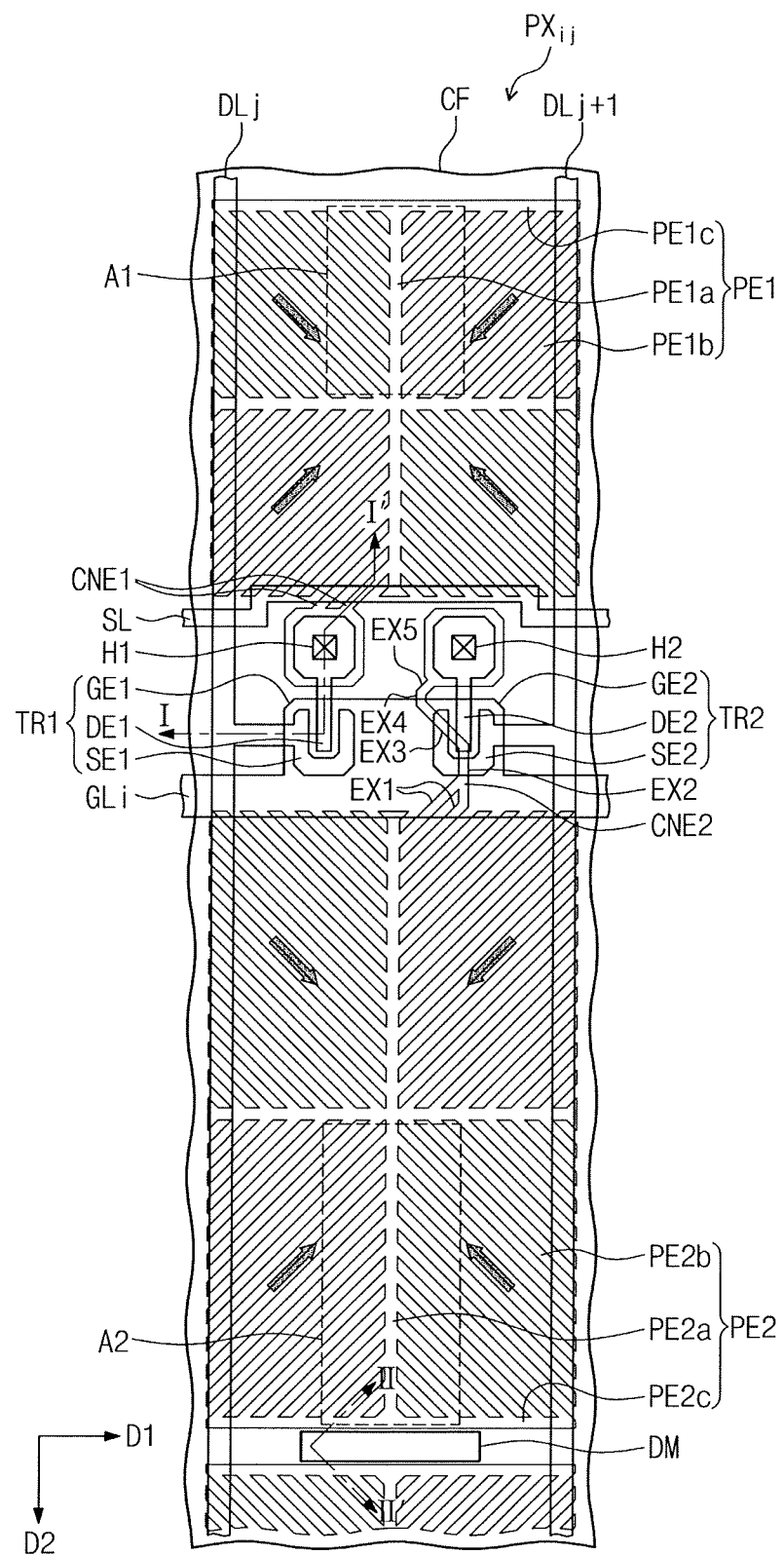
FIG. 2 is a layout diagram showing a pixel shown in FIG. 1 according to an exemplary embodiment of the present disclosure.

FIG. 2 is a layout diagram showing a pixel shown in FIG. 1 according to an exemplary embodiment of the present disclosure.

For convenience of explanation, FIG. 2 shows one pixel PXij, which will be described in detail. It is to be understood that other pixels of the display device 500 have the same configuration as pixel PXij.

Referring to FIG. 2, each of the data lines DL1 to DLm includes a first data line DLj and a second data line DLj+1. The pixel PXij is connected to the corresponding gate line GLi and the corresponding first and second data lines DLj and DLj+1.

The gate line GLi extends in a first direction D1. The first and second data lines DLj and DLj+1 extend in a second direction D2 crossing the first direction D1. The first direction D1 may be referred to herein as a row direction and the second direction D2 may be referred to herein as a column direction.

The pixel PXij includes a first sub-pixel and a second sub-pixel. The first sub-pixel includes a first transistor TR1 and a first pixel electrode PE1. The second sub-pixel includes a second transistor TR2 and a second pixel electrode PE2. The first and second pixel electrodes PE1 and PE2 are spaced apart from each other by a predetermined distance in the second direction D2. The first and second transistors TR1 and TR2 are disposed between the first pixel electrode PE1 and the second pixel electrode PE2.

The first transistor TR1 includes a first gate electrode GE1 branched from the gate line GLi, a first source electrode SE1 branched from the first data line DLj, and a first drain electrode DE1 connected to the first pixel electrode PE1. The first drain electrode DE1 extends toward and is electrically connected to a first connection electrode CNE1 branched from the first pixel electrode PE1 through a first contact hole H1.

The second transistor TR2 includes a second gate electrode GE2 branched from the gate line GLi, a second source electrode SE2 branched from the second data line DLj+1, and a second drain electrode DE2 connected to the second pixel electrode PE2. The second drain electrode DE2 extends toward and is electrically connected to a second connection electrode CNE2 branched from the second pixel electrode PE2 through a second contact hole H2.

The first and second data lines DLj and DLj+1 are disposed such that they respectively overlap predetermined areas of left and right boundaries of the first and second pixel electrodes PE1 and PE2. For example, the first data line DLj is disposed such that it overlaps the predetermined area of the left boundary of the first and second pixel electrodes PE1 and PE2, and the second data line DLj+1 is disposed such that it overlaps the predetermined area of the right boundary of the first and second pixel electrodes PE1 and PE2.

A storage line SL extends in the first direction D1. The storage line SL is disposed between the first and second pixel electrodes PE1 and PE2 such that it overlaps a predetermined area of a lower boundary of the first pixel electrode PE1. The storage line SL may be disposed on the same layer as the gate line. A storage voltage is applied to the storage line SL.

The gate line GLi is disposed between the first and second pixel electrodes PE1 and PE2 and extends in the first direction D1. In addition, the gate line GLi is disposed such that it overlaps a predetermined area of an upper boundary of the second pixel electrode PE2.

The first pixel electrode PE1 includes a first trunk portion PE1a, a plurality of first branch portions PE1b, a first connection portion PE1c, and the first connection electrode CNE1. The first trunk portion PE1a may have, for example, a cross shape as shown in FIG. 2. The first branch portions PE1b extend from the first trunk portion PE1a in a radial form. In this case, the first sub-pixel is divided into four domains by the first trunk portion PE1a, however, exemplary embodiments are not limited thereto.

The first branch portions PE1b extend in different directions according to each domain. The first branch portions PE1b extend substantially parallel to each other and are spaced apart from each other in each domain divided by the first trunk portion PE1a. A distance between two adjacent first branch portions PE1b may be measured in terms of a micrometer, and a plurality of micro-slits is formed.

The display panel 100 includes a first substrate, a second substrate, and a liquid crystal layer disposed between the first and second substrates, as described in further detail below with reference to FIG. 3.

Liquid crystal molecules of the liquid crystal layer are aligned in a specific azimuth pattern as a result of the above-described configurations of the first trunk portion PE1a and the first branch portions PE1b when viewed in a plan view.

Liquid crystal molecules of the liquid crystal layer of the first sub-pixel are pretilted in different directions in each domain due to the micro-slits. For example, in the exemplary embodiment shown in FIG. 2, four directions in which the liquid crystal molecules are aligned are toward the first trunk portion PE1a. Accordingly, four domains in which the liquid crystal molecules are aligned in different directions are formed in the liquid crystal layer. As described above, when the liquid crystal molecules are aligned in various directions, a reference viewing angle of the display device 500 including the liquid crystal layer may be improved.

The first connection portion PE1c connects the first trunk portion PE1a and the first branch portions PE1b in the upper boundary of the first pixel electrode PE1.

The first connection electrode CNE1 is branched from two first branch portions PE1b neighboring a left side of a lower portion of the first trunk portion PE1a extending in the second direction D2. The first connection electrode CNE1 extends such that it makes an acute angle with the first direction D1 and is electrically connected to the first drain electrode DE1 of the first transistor TR1 through the first contact hole H1. The acute angle between the first connection electrode CNE1 and the first direction D1 may be in a range from, for example, about 30 degrees to about 60 degrees. However, the acute angle is not limited thereto.

The first pixel electrode PE1 may include a transparent conductive material such as, for example, indium tin oxide (ITO), indium zinc oxide (IZO), indium tin zinc oxide (ITZO), etc.

The second pixel electrode PE2 has an area greater than that of the first pixel electrode PE1 when viewed in a plan view. The second pixel electrode PE2 may include the same material as that of the first pixel electrode PE1.

The second pixel electrode PE2 includes a second trunk portion PE2a, a plurality of second branch portions PE2b, a second connection portion PE2c, and the second connection electrode CNE2. The second trunk portion PE2a and the second branch portions PE2b of the second pixel electrode PE2 have the same structure and function as those of the first trunk portion PE1a and the first branch portions PE1b of the first pixel electrode PE1. Thus, for convenience of explanation, a detailed description of the second trunk portion PE2a and the second branch portions PE2b is omitted.

The second connection portion PE2c connects the second trunk portion PE2a and the second branch portions PE2b in the lower boundary of the second pixel electrode PE2.

The second connection electrode CNE2 includes first, second, third, fourth, and fifth extension portions EX1, EX2, EX3, EX4, and EX5. The first extension portion EX1 is branched from two second branch portions PE2b neighboring a right side of an upper portion of the second trunk portion PE2a. The first extension portion EX1 extends such that it makes an acute angle with the first direction D1. The acute angle between the first extension portion EX1 and the first direction D1 may be in a range from, for example, about 30 degrees to about 60 degrees. However, the acute angle is not limited thereto.

The second extension portion EX2 is connected to an upper portion of the first extension portion EX1 and extends upwardly. The third extension portion EX3 is connected to an upper portion of the second extension portion EX2 and extends such that it makes an obtuse angle with the first direction D1. The obtuse angle between the third extension portion EX3 and the first direction D1 may be in a range from, for example, about 120 degrees to about 150 degrees. However, the obtuse angle is not limited thereto. The second and third extension portions EX2 and EX3 are disposed such that they partially overlap the second transistor TR2.

The fourth extension portion EX4 is connected to an upper portion of the third extension portion EX3 and extends upwardly. The fifth extension portion EX5 is connected to an upper portion of the fourth extension portion EX4 and extends such that it makes an acute angle with the first direction D1. The fifth extension portion EX5 is electrically connected to the second drain electrode DE2 of the second transistor TR2 through the second contact hole H2. The acute angle between the fifth extension portion EX5 and the first direction D1 may be in a range from, for example, about 30 degrees to about 60 degrees. However, the acute angle is not limited thereto.

Due to the structure of the first and second pixel electrodes PE1 and PE2, a response time of the display device 500 may be shortened and twisting of the liquid crystal molecules may be prevented.

A color filter CF extends in the second direction D2 and is disposed such that it overlaps the pixel PXij. A plurality of color filters CF extend in the second direction D2 in the display area DA. Each color filter CF is disposed such that it overlaps the pixels arranged in the second direction D2. The color filters CF are arranged such that they are adjacent to each other in the first direction D1 and such that they make contact with each other.

A dummy member DM is disposed between the pixels adjacent to each other in the second direction D2. For example, in the exemplary embodiment shown in FIG. 2, the dummy member DM is disposed between the pixel PXij and the pixel disposed at a lower portion of the pixel PXij. In addition, the dummy member DM may be disposed between the pixel PXij shown in FIG. 2 and the pixel disposed at an upper portion of the pixel PXij.

The dummy member DM is disposed between the first pixel electrode PE1 of one pixel and the second pixel electrode PE2 of an adjacent pixel in the second direction D2. For example, in FIG. 2, the dummy member DM is disposed between the second pixel electrode PE2 of the pixel PXij and the first pixel electrode of the pixel disposed at the lower portion of the pixel PXij.

The dummy member DM extends in the first direction D1. A length of the dummy member DM in the first direction D1 is smaller than a width of the first and second pixel electrodes PE1 and PE2 in the first direction D1.

A center portion of the dummy member DM is disposed such that it corresponds to a center portion of the first and second pixel electrodes PE1 and PE2 in the first direction D1. For example, the center portion in the first direction D1 of the dummy member DM is disposed such that it corresponds to the first and second trunk portions PE1a and PE2a extending in the second direction D2.

The dummy member DM may be disposed on the same layer as the gate line GLi and/or as the data lines DLj and DLj+1, as described in further detail below.

Hereinafter, a predetermined area of the center portion of the first pixel electrode PE1 may be referred to as a first area A1 disposed in an area above the part of the first trunk portion PE1a that extends in the first direction D1 when viewed in a plan view, and a predetermined area of the center portion of the second pixel electrode PE2 may be referred to as a second area A2 disposed in an area below the part of the second trunk portion PE2a that extends in the first direction D1 when viewed in a plan view.

As represented by arrows in FIG. 2, the normal alignment direction of the liquid crystal molecules, which may be referred to herein as directors of the liquid crystal molecules, is configured to include four directions extending toward the first trunk portion PE1a in the first sub-pixel, and four directions extending toward the second trunk portion PE2a in the second sub-pixel.

When the dummy member DM is not included in the display device 500, the directors of the liquid crystal molecules may be twisted in the first and second areas A1 and A2 when external pressure and impact are applied to the display device 500. For example, when the dummy member DM is not included, when the external pressure and impact are applied to the display device 500, the directors of the liquid crystal molecules may be twisted in directions different from the directions indicated by the arrows shown in FIG. 2 in the first and second areas A1 and A2. The liquid crystal molecules in which the directors thereof are twisted may not return to their original positions.

However, according to exemplary embodiments of the present disclosure, the inclusion of the dummy member DM may improve a control force against the alignment direction of the liquid crystal molecules. Accordingly, even though external pressure and impact are applied to the display device 500, the directors of the liquid crystal molecules in the first and second areas A1 and A2 may be controlled to face the first and second trunk portions PE1a and PE2a by the dummy member DM. The dummy member DM will be described in further detail below.

Figure 3:
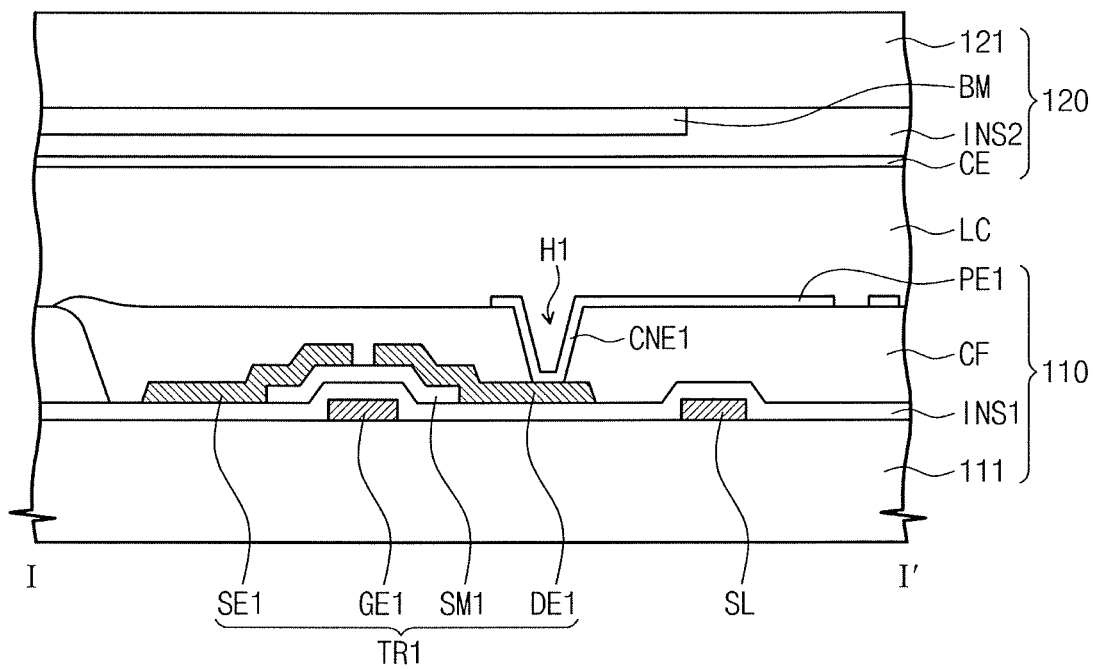
FIG. 3 is a cross-sectional view taken along line I-I' shown in FIG. 2 according to an exemplary embodiment of the present disclosure.

FIG. 3 is a cross-sectional view taken along line I-I' shown in FIG. 2 according to an exemplary embodiment of the present disclosure.

Referring to FIG. 3, the display panel 100 includes a first substrate 110, a second substrate 120 facing the first substrate 110, and a liquid crystal layer LC disposed between the first substrate 110 and the second substrate 120. The first substrate 110 includes a first base substrate 111, the first transistor TR1 disposed on the first base substrate 111, the color filter CF, and the first pixel electrode PE1.

The second transistor TR2 and the second pixel electrode PE2 have the same structure and configuration as those of the first transistor TR1 and the first pixel electrode PE1. Therefore, for convenience of explanation, only the structure and function of the first transistor TR1 and the first pixel electrode PE1 will be described in detail, and detailed descriptions of the second transistor TR2 and the second pixel electrode PE2 will be omitted.

The first gate electrode GE1 of the first transistor TR1 is disposed on the first base substrate 111. The first base substrate 111 may be, for example, a transparent or non-transparent insulating substrate. For example, the first base substrate 111 may be a silicon substrate, a glass substrate, or a plastic substrate. However, the first base substrate 111 is not limited thereto. The storage line SL is disposed on the first base substrate 111. The storage line SL may be disposed on the same layer as the first gate electrode GE1.

A first insulating layer INS1 is disposed on the first base substrate 111 such that it covers the first gate electrode GE1 and the storage line SL. The first insulating layer INS1 may be referred to herein as a gate insulating layer. The first insulating layer INS1 may be, for example, an inorganic insulating layer including an inorganic material. However, the first insulating layer INS1 is not limited thereto.

A first semiconductor layer SM1 of the first transistor TR1 is disposed on the first insulating layer INS1 that covers the first gate electrode GE1. The first semiconductor layer SM1 may include, for example, an active layer and an ohmic contact layer.

The first source electrode SE1 and the first drain electrode DE1 of the first transistor TR1 are disposed on the first semiconductor layer SM1 and the first insulating layer INS1 and are spaced apart from each other. The first semiconductor layer SM1 forms a conductive channel between the first source electrode SE1 and the first drain electrode DE1.

The color filter CF is disposed on the first insulating layer INS1 such that it covers the first transistor TR1. The color filters CF adjacent to each other are overlapped with each other in a predetermined area of the boundary therebetween. Each of the color filters CF assigns a color to the light transmitting through the pixel. Each of the color filters CF is, for example, a red color filter, a green color filter, or a blue color filter. The red, green, and blue color filters may be sequentially arranged in the first direction D1.

The first contact hole H1 is formed through the color filter CF to expose a predetermined area of the first drain electrode DE1. The first pixel electrode PE1 is disposed on the color filter CF. The first connection electrode CNE1 branched from the first pixel electrode PE1 is electrically connected to the first drain electrode DE1 through the first contact hole H1.

The second substrate 120 includes a second base substrate 121, a black matrix BM disposed under the second base substrate 121, and a common electrode CE disposed under the second base substrate 121. The black matrix BM is disposed at a position between the first pixel electrode PE1 and the second pixel electrode PE2 in the second direction D2 and extends in the first direction D1.

The black matrix BM is disposed at a position between the first pixel electrodes PE1 adjacent to each other in the first direction D1 (e.g., first pixel electrodes PE1 of adjacent pixels) and between the second pixel electrodes PE2 adjacent to each other in the first direction D1 (e.g., second pixel electrodes PE2 of adjacent pixels). In addition, the black matrix BM is disposed such that it overlaps the data lines DLj and DLj+1. The black matrix BM blocks unnecessary light to display the image.

A second insulating layer INS2 is disposed under the second base substrate 121 such that it covers the black matrix BM. The second insulating layer INS2 may be, for example, an organic insulating layer including an organic material. However, the second insulating layer INS2 is not limited thereto. The common electrode CE is disposed under the second insulating layer INS2. The common electrode CE includes a transparent conductive material such as, for example, indium tin oxide, indium zinc oxide, indium tin zinc oxide, etc.

The data voltage is applied to the first pixel electrode PE1 through the first transistor TR1 and the common voltage is applied to the common electrode CE. An electric field is formed between the first pixel electrode PE1 and the common electrode CE by the difference in voltage between the data voltage and the common voltage.

The liquid crystal molecules of the liquid crystal layer LC are driven by the electric field formed between the first pixel electrode PE1 and the common electrode CE. A transmittance of the light passing through the liquid crystal layer LC is controlled by the liquid crystal molecules driven in response to the electric field, and thus, desired images are displayed. The operation of the first and second sub-pixels of the pixel PXij will be described in further detail below with reference to FIG. 7.

Figure 4:
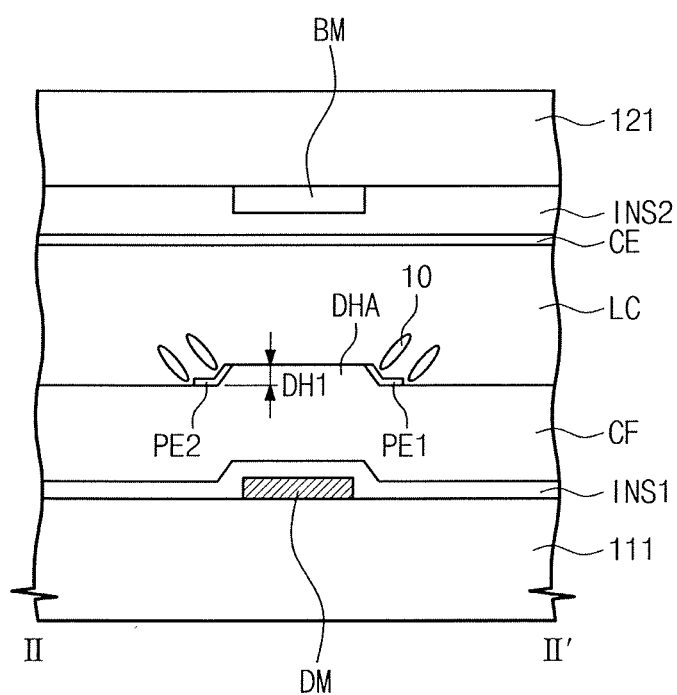
FIGS. 4 to 6 are cross-sectional views taken along line II-II' showing various structures of dummy members according to exemplary embodiments of the present disclosure.
Figure 5:
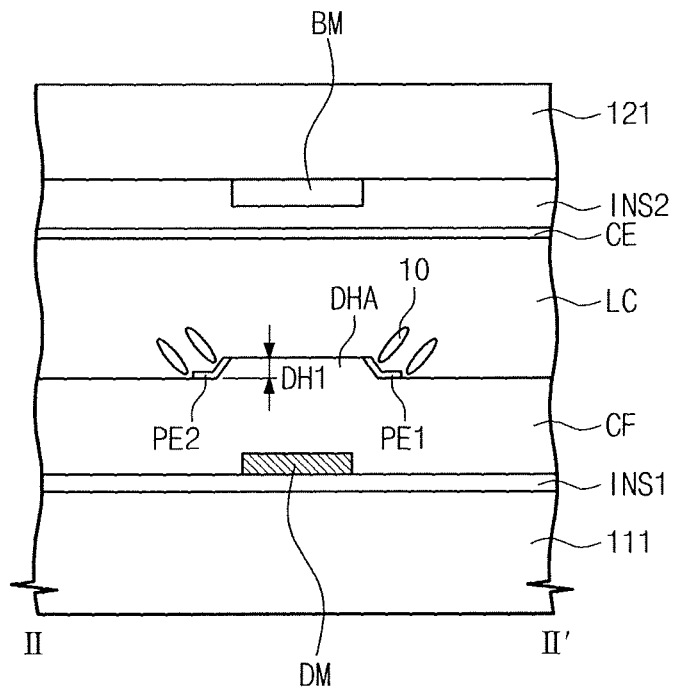
Figure 6:
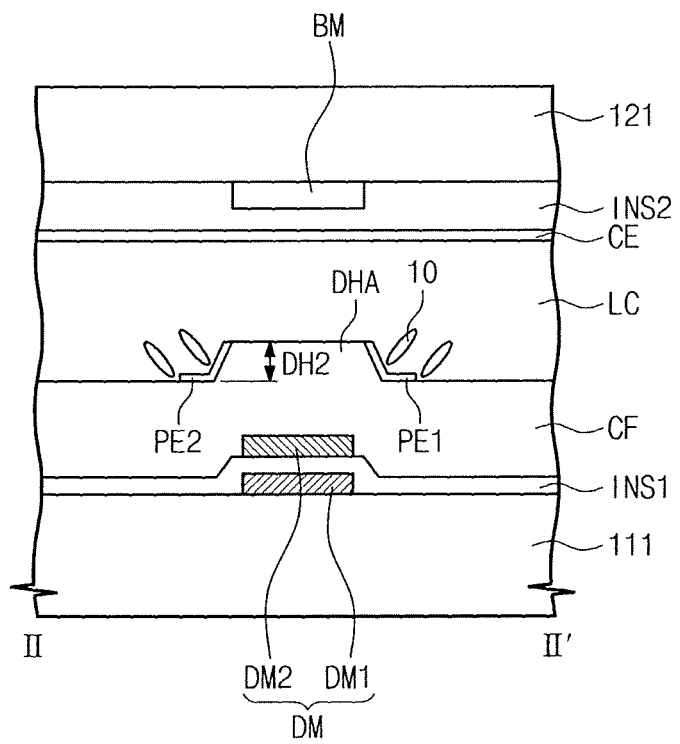

FIGS. 4 to 6 are cross-sectional views taken along line II-II' of FIG. 2 and show various structures of dummy members according to exemplary embodiments of the present disclosure.

Referring to FIG. 4, in an exemplary embodiment, the dummy member DM is disposed on the first base substrate 111. The dummy member DM is formed together with the gate line GLi using the same material as the gate line GLi, and is disposed on the same layer as the gate line GLi. Thus, in the exemplary embodiment shown in FIG. 4, the dummy member DM is substantially simultaneously patterned together with the first gate electrode GE1 branched from the gate line GLi, and the dummy member DM is disposed on the same layer as the first gate electrode GE1.

The first insulating layer INS1 is disposed on the first base substrate 111 such that it covers the dummy member DM. The color filter CF is disposed on the first insulating layer INS1.

The area of the color filter CF, which corresponds to the area in which the dummy member DM is disposed, will be referred to herein as a step difference area DHA. The color filter CF has a height in the step difference area DHA that is larger than that of the color filter CF in a peripheral area of the step difference area DHA (e.g., in an area(s) near (e.g., adjacent to) the step difference area DHA). For convenience of explanation, the step difference area DHA in FIG. 4 is shown as having a width greater than that of the dummy member DM.

The color filter CF in the step difference area DHA has a first step difference DH1 defined by the difference in height between the color filter CF in the step difference area DHA and the color filter CF in the peripheral area. The first step difference DH1 corresponds to a thickness of the dummy member DM. The thickness of the dummy member DM is defined by a difference in height between a lower surface of the dummy member DM and an upper surface of the dummy member DM.

As shown in FIG. 4, left and right boundary areas of the color filter CF in the step difference area DHA have an inclined surface, and thus, a width between the left and right boundary areas of the color filter CF in the step difference area DHA gradually becomes more narrow as a distance from the upper surface of the color filter CF decreases. In this case, the liquid crystal molecules 10 are pretilted in a predetermined direction with respect to the inclined surface of the color filter CF in the step difference area DHA.

The liquid crystal molecules disposed in the first and second areas A1 and A2 are pretilted in the same direction as the liquid crystal molecules 10 pretilted in the predetermined direction.

As a result, the directors of the liquid crystal molecules in the first area A1 are controlled to face the first trunk portion PE1a, and the directors of the liquid crystal molecules in the second area A2 are controlled to face the second trunk portion PE2a. Thus, in an exemplary embodiment, the control force against the alignment direction of the liquid crystal molecules in the first and second areas A1 and A2 may be improved. When the dummy member DM is not included in the display device 500, an initial alignment direction of the liquid crystal molecules may face the first and second trunk portions PE1a and PE2a. However, when external pressure and impact are applied to the display device 500, the directors of the liquid crystal molecules in the first and second areas A1 and A2 may be twisted in a different direction other than facing the first and second trunk portions PE1a and PE2a. The liquid crystal molecules of the first and second areas A1 and A2, which are twisted in this different direction, may not return to the initial alignment direction.

However, according to the exemplary embodiment shown in FIG. 4, the control force against the directors of the liquid crystal molecules in the first and second areas A1 and A2 may be improved by the step difference area DHA of the color filter CF, which is caused by the dummy member DM. Thus, the directors of the liquid crystal molecules in the first and second areas A1 and A2 may face the first and second trunk portions PE1a and PE2a. In this case, although external pressure and impact are applied to the display device 500, the directors of the liquid crystal molecules in the first and second areas A1 and A2 may be maintained to face the first and second trunk portions PE1a and PE2a.

According to exemplary embodiments, the color filter CF described with reference to FIG. 2 may have the step difference by the first transistor TR1. However, for convenience of explanation, the step difference, which is formed by the first transistor TR1, has been omitted in FIG. 2.

Referring to FIG. 5, in an exemplary embodiment, the first insulating layer INS1 is disposed on the first base substrate 111 and the dummy member DM is disposed on the first insulating layer INS1.

The dummy member DM is formed together with the first and second data lines DLj and DLj+1 using the same material, and is disposed on the same layer as the first and second data lines DLj and DLj+1. Thus, in the exemplary embodiment shown in FIG. 5, the dummy member DM is substantially simultaneously patterned together with the first source electrode SE1 branched from the first data line DLj, and the dummy member DM is disposed on the same layer as the first source electrode SE1.

The color filter CF is disposed on the first insulating layer INS1 such that it covers the dummy member DM. As shown in FIG. 5, the color filter CF has the first step difference DH1 in the step difference area DHA. However, unlike the exemplary embodiment shown in FIG. 4, the dummy member DM is disposed on the first insulating layer INS1.

Thus, in the exemplary embodiment shown in FIG. 5, the liquid crystal molecules 10 are pretilted in the predetermined direction by the inclined surface of the color filter CF having the first step difference DH1 in the step difference area DHA. Due to the step difference area DHA of the color filter CF, which is formed by the dummy member DM, the control force against the directors of the liquid crystal molecules disposed in the first and second areas A1 and A2 may be improved.

Referring to FIG. 6, in an exemplary embodiment, the dummy member DM includes a first dummy member DM1 and a second dummy member DM2 having about the same size as that of the first dummy member DM1. The first dummy member DM1 is disposed on the first base substrate 111. The first dummy member DM1 is substantially and simultaneously formed with the gate line GLi using the same material, and is disposed on the same layer as the gate line GLi.

The first insulating layer INS1 is disposed on the first base substrate 111 such that it covers the first dummy member DM1. The second dummy member DM2 is disposed on the first insulating layer INS1 such that it overlaps the first dummy member DM1. The second dummy member DM2 is substantially and simultaneously formed with the first and second data lines DLj and DLj+1 using the same material, and is disposed on the same layer as the first and second data lines DLj and DLj+1.

The area of the color filter CF, which corresponds to the area in which the first and second dummy members DM1 and DM2 are disposed, may be referred to herein as a step difference area DHA. The color filter CF has a height in the step difference area DHA that is larger than that of the color filter CF in a peripheral area of the step difference area DHA (e.g., in an area(s) near (e.g., adjacent to) the step difference area DHA).

The color filter CF in the step difference area DHA has a second step difference DH2 defined by the difference in height between the color filter CF in the step difference area DHA and the color filter CF in the peripheral area. The second step difference DH2 corresponds to a sum of the thickness of the first dummy member DM1 and the thickness of the second dummy member DM2.

As shown in FIG. 6, left and right boundary areas of the color filter CF in the step difference area DHA have an inclined surface, and thus, a width between the left and right boundary areas of the color filter CF in the step difference area DHA gradually becomes more narrow as a distance from the upper surface of the color filter CF decreases. In this case, the liquid crystal molecules 10 are pretilted in a predetermined direction with respect to the inclined surface of the color filter CF in the step difference area DHA.

As a result, the control force against the directors of the liquid crystal molecules in the first and second areas A1 and A2 may be improved by the step difference area DHA of the color filter CF, which is caused by the first and second dummy members DM1 and DM2.

Therefore, according to exemplary embodiments of the present disclosure, the display device 500 may improve the control force of the directors of the liquid crystal molecules with respect to external pressure and impact applied to the display device 500.

Figure 7:
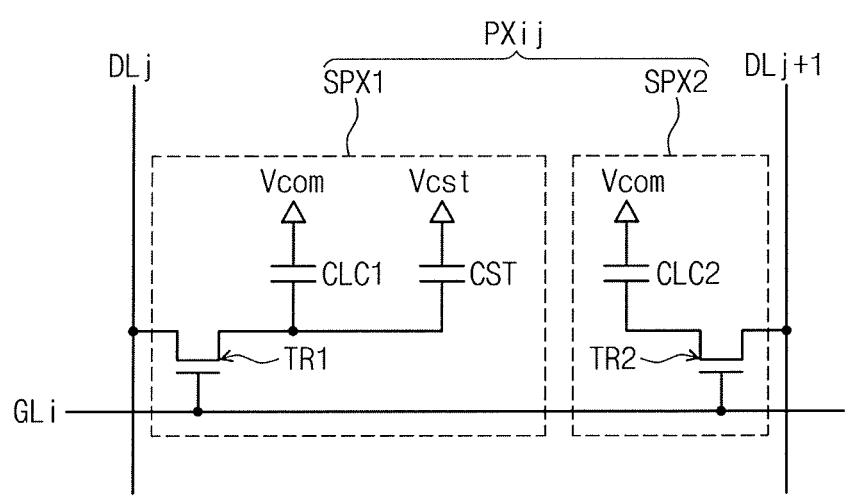
FIG. 7 is an equivalent circuit diagram showing the pixel shown in FIG. 2 according to an exemplary embodiment of the present disclosure.

FIG. 7 is an equivalent circuit diagram showing the pixel shown in FIG. 2 according to an exemplary embodiment of the present disclosure.

Referring to FIG. 7, the pixel PXij includes the first sub-pixel SPX1 and the second sub-pixel SPX2, which respectively correspond to the first and second sub-pixels described with reference to FIG. 2. The first sub-pixel SPX1 includes the first transistor TR1, a first liquid crystal capacitor CLC1, and a storage capacitor CST. The second sub-pixel SPX2 includes the second transistor TR2 and a second liquid crystal capacitor CLC2.

The first liquid crystal capacitor CLC1 is formed by the first pixel electrode PE1, the common electrode CE, and the liquid crystal layer LC disposed between the first pixel electrode PE1 and the common electrode CE. The storage capacitor CST is formed by the first pixel electrode PE1 and the storage line SL partially overlapped with the first pixel electrode PE1. The second liquid crystal capacitor CLC2 is formed by the second pixel electrode PE2, the common electrode CE, and the liquid crystal layer LC disposed between the second pixel electrode PE2 and the common electrode CE.

Hereinafter, the data voltage provided through the first data line DLj is referred to as a first data voltage and the data voltage provided through the second data line DLj+1 is referred to as a second data voltage.

The first and second transistors TR1 and TR2 are turned on in response to the gate signal provided through the gate line GLi. The first data voltage provided through the first data line DLj is applied to the first pixel electrode PE1 through the turned-on first transistor TR1. The common electrode CE is applied with the common voltage Vcom.

The first liquid crystal capacitor CLC1 is charged with a first pixel voltage corresponding to a voltage difference between the first data voltage applied to the first pixel electrode PE1 and the common voltage Vcom applied to the common electrode. Accordingly, the first sub-pixel SPX1 is charged with the first pixel voltage. The storage capacitor CST complements the first pixel voltage charged in the first liquid crystal capacitor CLC1.

The second data voltage provided through the second data line DLj+1 is applied to the second pixel electrode PE2 through the turned-on second transistor TR2. The second liquid crystal capacitor CLC2 is charged with a voltage corresponding to a voltage difference between the second data voltage applied to the second pixel electrode PE2 and the common voltage Vcom applied to the common electrode CE. Accordingly, the second sub-pixel SPX2 is charged with the second pixel voltage.

The voltage difference between the second data voltage and the common voltage Vcom is smaller than the voltage difference between the first data voltage and the common voltage Vcom. Therefore, the second pixel voltage is smaller than the first pixel voltage.

When the first and second sub-pixels SPX1 and SPX2 of the pixel PXij are charged with the first and second pixel voltages having different voltage levels, respectively, the eyes of a viewer viewing the display device 500 recognizes a gray scale level corresponding to the intermediate value between the first and second pixel voltages. In this case, deterioration of a side viewing angle, which may be caused by distortion of a gamma curve below the intermediate gray scale level, may be prevented, and thus, side visibility of the display apparatus 500 may be improved.

Figure 8:
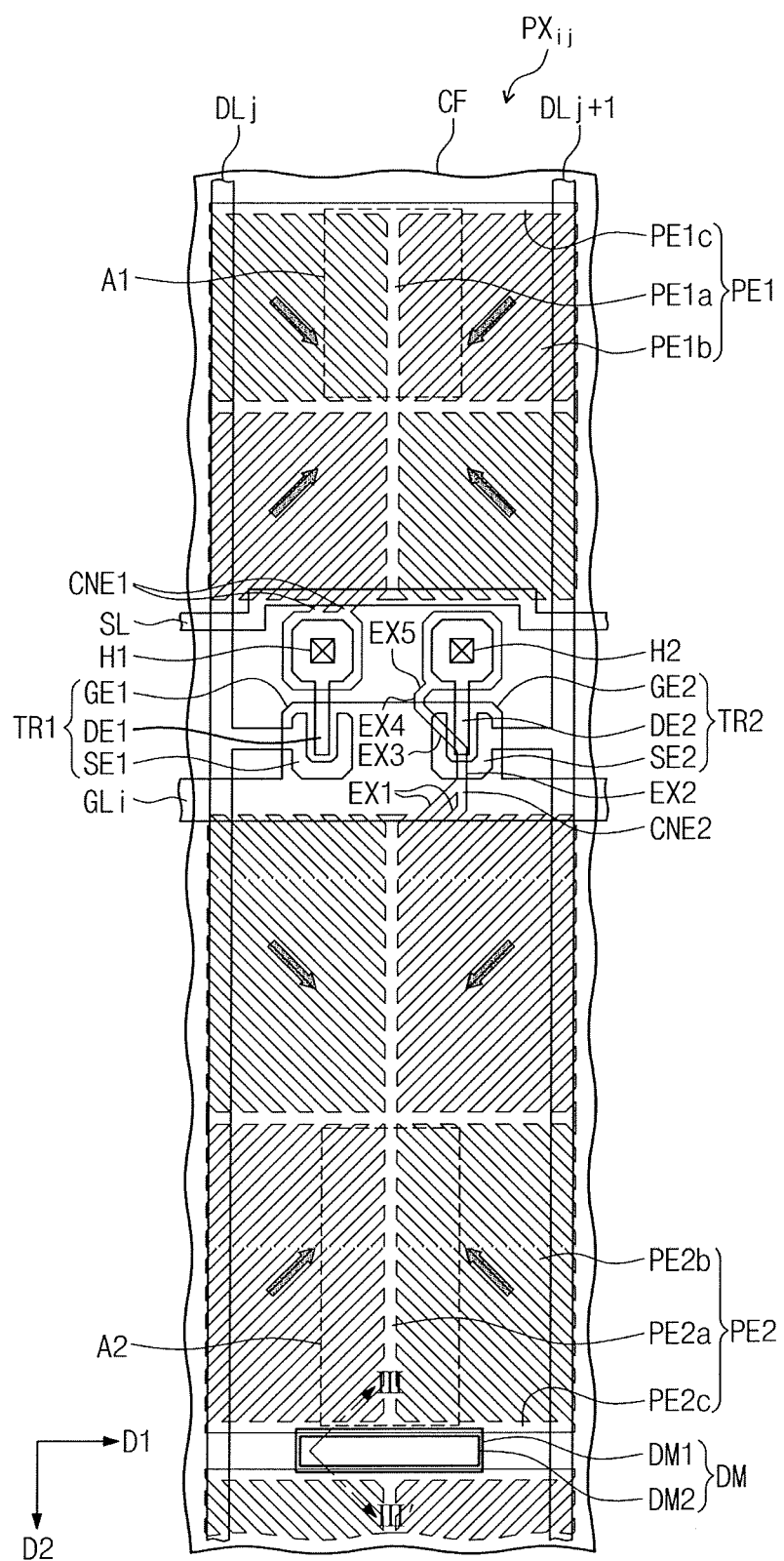
FIG. 8 is a layout diagram showing a pixel of a display device according to an exemplary embodiment of the present disclosure.
Figure 9:
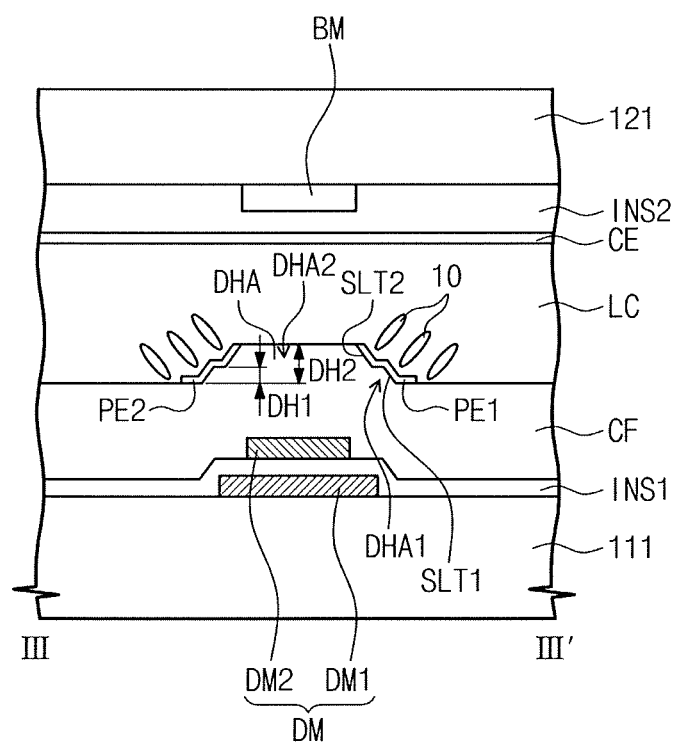
FIG. 9 is a cross-sectional view taken along line III-III' shown in FIG. 8 according to an exemplary embodiment of the present disclosure.

FIG. 8 is a layout diagram showing a pixel of a display device according to an exemplary embodiment of the present disclosure. FIG. 9 is a cross-sectional view taken along line shown in FIG. 8 according to an exemplary embodiment of the present disclosure.

The pixel PXij shown in FIG. 8 has the same structure and function as those of the pixel PXij shown in FIG. 2 except for the dummy member DM. Thus, for convenience of explanation, only the dummy member DM will be described in detail with reference to FIGS. 8 and 9.

Referring to FIG. 8, the dummy member DM extends in the first direction D1. The dummy member DM includes a first dummy member DM1 and a second dummy member DM2 having a size smaller than that of the first dummy member DM1 and being overlapped with the first dummy member DM1.

A predetermined area of an upper portion of the first dummy member DM1 is disposed such that it overlaps a predetermined area of a lower boundary of the second pixel electrode PE2 adjacent to the first dummy member DM1 in the second direction D2. A predetermined area of a lower portion of the first dummy member DM1 is disposed such that it overlaps a predetermined area of an upper portion of a first pixel electrode PE1 of an adjacent pixel that is adjacent to the first dummy member DM1 in the second direction D2.

For example, the predetermined area of the upper portion of the first dummy member DM1 is disposed such that it overlaps the predetermined area of the lower portion of the second connection portion PE2c of the second pixel electrode PE2 adjacent to the first dummy member DM1 in the second direction D2. The predetermined area of the lower portion of the first dummy member DM1 is disposed such that it overlaps the predetermined area of the lower portion of the first connection portion PE1c of the first pixel electrode PE1 of an adjacent pixel adjacent to the first dummy member DM1 in the second direction D2.

The second dummy member DM2 is disposed between the first pixel electrode PE1 and the second pixel electrode PE2, which are adjacent to each other in the second direction D2 and are disposed in different pixels from each other, as described above.

A length in the first direction D1 of the first and second dummy members DM1 and DM2 is smaller than the width between the left and right sides of the first and second pixel electrodes PE1 and PE2. The length in the first direction D1 of the first dummy member DM1 is longer than the length in the first direction D1 of the second dummy member DM2. A center portion of the first and second dummy members DM1 and DM2 is disposed at a position corresponding to a center portion of the first and second dummy members DM1 and DM2 in the first direction D1.

Referring to FIG. 9, the first dummy member DM1 is disposed on the first base substrate 111, and the first insulating layer INS1 is disposed on the first base substrate 111 such that it covers the first dummy member DM1.

The second dummy member DM2 having the size smaller than that of the first dummy member DM1 is disposed on the first insulating layer INS1 such that it overlaps the first dummy member DM1.

The area of the color filter CF, which corresponds to the area in which the first and second dummy members DM1 and DM2 are disposed, may be referred to herein as a step difference area DHA. The color filter CF has a height in the step difference area DHA that is larger than that of the color filter CF in a peripheral area of the step difference area DHA (e.g., in an area(s) near (e.g., adjacent to) the step difference area DHA).

A first step difference area DHA1 corresponds to an area of the color filter CF which corresponds to the area in which the first dummy member DM1 not overlapped with the second dummy member DM2 is disposed. A second step difference area DHA2 corresponds to an area of the color filter CF which corresponds to the area in which the first and second dummy members DM1 and DM2 overlapped with each other is disposed.

When viewed in a cross-sectional view, the first step difference area DHA1 is disposed at left and right sides of the second step difference area DHA2, and the first step difference area DHA1 may be disposed such that it surrounds the second step difference area DHA2 when viewed in a plan view.

The color filter CF in the first step difference area DHA1 has a first step difference DH1 defined by the difference in height between the color filter CF in the first step difference area DHA1 and the color filter CF in the peripheral area of the step difference area DHA. The first step difference DH1 corresponds to the thickness of the first dummy member DM1.

The color filter CF in the second step difference area DHA2 has the second step difference DH2 defined by the difference in height between the color filter CF in the second step difference area DHA2 and the color filter CF in the peripheral area of the step difference area DHA. The second step difference DH2 corresponds to a sum of the thickness of the first dummy member DM1 and the thickness of the second dummy member DM2.

The second step difference DH2 is greater than the first step difference DH1. Accordingly, the height of the color filter CF in the second step difference area DHA2 is greater than the height of the color filter CF2 in the first step difference area DHA1.

Left and right boundary areas of the color filter CF in the first step difference area DHA1 have a first inclined surface SLT1, and thus, a width between the left and right boundary areas of the color filter CF in the first step difference area DHA1 gradually becomes more narrow as a distance from the upper surface of the color filter CF in the first step difference area DHA1 decreases. Left and right boundary areas of the color filter CF in the second step difference area DHA2 have a second inclined surface SLT2, and thus, a width between the left and right boundary areas of the color filter CF in the second step difference area DHA2 gradually becomes more narrow as a distance from the upper surface of the color filter CF in the second step difference area DHA2 decreases.

In this case, the liquid crystal molecules 10 are pretilted in a predetermined direction by the first inclined surface SLT1 of the color filter CF in the first step difference area DHA1 and the second inclined surface SLT2 of the color filter CF in the second step difference area DHA2.

As a result, the control force against the directors of the liquid crystal molecules in the first and second areas A1 and A2 may be improved by the first and second step difference areas DHA1 and DHA2 of the color filter CF, which is caused by the first and second dummy members DM1 and DM2.

Therefore, according to exemplary embodiments of the present disclosure, the display device 500 may improve the control force of the directors of the liquid crystal molecules with respect to the external pressure and impact applied to the display device 500.

Figure 10:
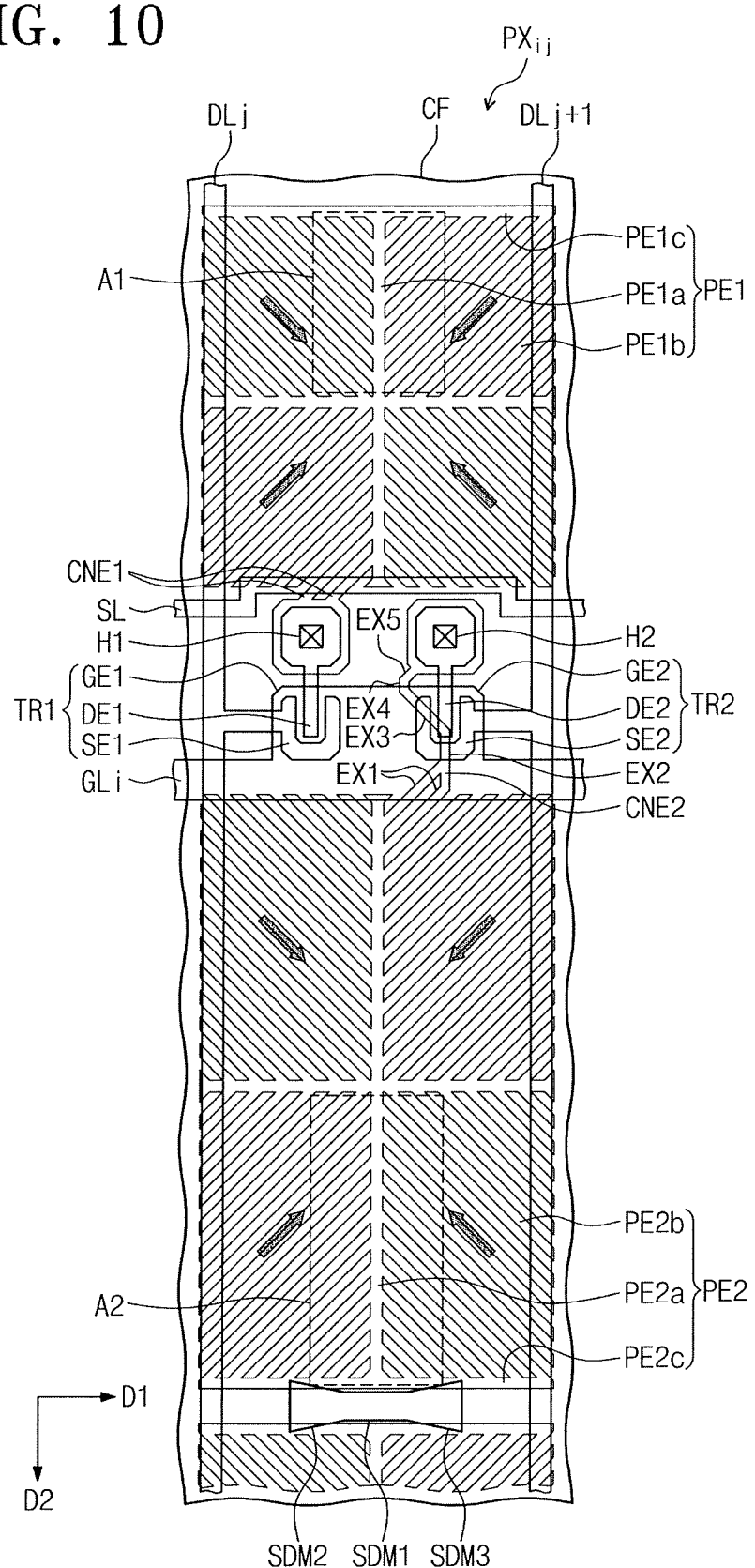
FIG. 10 is a layout diagram showing a pixel of a display device according to an exemplary embodiment of the present disclosure.

FIG. 10 is a layout diagram showing a pixel of a display device according to an exemplary embodiment of the present disclosure.

The pixel PXij shown in FIG. 10 has the same structure and function as those of the pixel PXij shown in FIG. 2 except for the dummy member DM. Thus, for convenience of explanation, only the dummy member DM will be described in detail with reference to FIG. 10.

Referring to FIG. 10, a length in the first direction D1 of the dummy member DM is smaller than the width between the left and right sides of the first and second pixel electrodes PE1 and PE2.

The dummy member DM includes a first sub-dummy member SDM1, a second sub-dummy member SDM2, and a third sub-dummy member SDM3. The first sub-dummy member SDM1 extends in the first direction D1. The second sub-dummy member SDM2 is connected to one side portion of the first sub-dummy member SDM1 in the first direction D1, and the third sub-dummy member SDM3 is connected to the opposing side portion of the first sub-dummy member SDM1 in the first direction D1.

The first sub-dummy member SDM1 is disposed between the second and first pixel electrodes PE2 and PE1, which are adjacent to each other in the second direction D2 and disposed in different pixels from each other, as described above. A center portion in the first direction D1 of the first sub-dummy member SDM1 is disposed to match the extension direction of the first and second trunk portions PE1a and PE2a extending in the second direction D2.

A width in the second direction D2 of the second sub-dummy member SDM2 becomes larger as a distance from the one side portion of the first sub-dummy member SDM1 increases. A width in the second direction D2 of the third sub-dummy member SDM3 becomes larger as a distance from the other side portion of the first sub-dummy member SDM1 increases. The second and third sub-dummy members SDM2 and SDM3 may have a symmetrical shape with each other.

A predetermined area of an upper portion of the second and third sub-dummy members SDM2 and SMD3 is overlapped with a predetermined area of a lower boundary of the second pixel electrode PE2 adjacent to the second and third sub-dummy members SDM2 and SDM3 in the second direction D2. A predetermined area of a lower portion of the second and third sub-dummy members SDM2 and SMD3 is overlapped with a predetermined area of an upper boundary of the first pixel electrode PE1 of an adjacent pixel adjacent to the second and third sub-dummy members SDM2 and SDM3 in the second direction D2.

For example, the predetermined area of the upper portion of the second and third sub-dummy members SDM2 and SDM3 is overlapped with the predetermined area of the second connection portion PE2c of the second pixel electrode PE2 adjacent to the second and third sub-dummy members SDM2 and SDM3 in the second direction D2. The predetermined area of the lower portion of the second and third sub-dummy members SDM2 and SDM3 is overlapped with the predetermined area of the first connection portion PE1c of the first pixel electrode PE1 of an adjacent pixel adjacent to the second and third sub-dummy members SDM2 and SDM3 in the second direction D2.

The dummy member DM may be disposed on the same layer as the gate line GLi or the first and second data lines DLj and DLj+1 as described above with reference to FIGS. 4 and 5.

The dummy member DM may include the first dummy member DM1 disposed on the same layer as the gate line GLi and the second dummy member DM2 disposed on the same layer as the first and second data lines DLj and DLj+1 as described above with reference to FIG. 6.

The dummy member DM1 may include the first dummy member DM1 and the second dummy member DM2 having the size smaller than that of the first dummy member DM1 and being disposed such that it overlaps the first dummy member DM1 as described above with reference to FIGS. 8 and 9.

Referring to FIG. 10, the liquid crystal molecules may be pretilted in the predetermined direction by the inclined surface in the left and right boundary areas of the color filter CF in the step difference area caused by the dummy member DM when viewed in a cross-sectional view.

As a result, the control force against the directors of the liquid crystal molecules in the first and second areas A1 and A2 may be improved by the step difference area of the color filter CF, which is caused by the dummy member DM.

Consequently, the display device according to exemplary embodiments of the present disclosure may improve the control force of the directors of the liquid crystal molecules with respect to external pressure and impact applied to the display device 500.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display device, comprising:
   a gate line extending in a first direction;
   a data line extending in a second direction crossing the first direction;
   a transistor connected to the gate line and the data line;
   a first insulating layer disposed on the transistor;
   a pixel electrode disposed on the first insulating layer and connected to the transistor;
   a dummy member disposed adjacent to the pixel electrode in the second direction; and
   a first base substrate on which the dummy member and the transistor are disposed,
   wherein the first insulating layer covers the dummy member, a first height defined by a distance from an upper surface of the first base substrate to an upper surface of the first insulating layer in a step difference area is larger than a second height defined by a distance from the upper surface of the first base substrate to the upper surface of the first insulating layer in a peripheral area near the step difference area, and
   the step difference area corresponds to an area of the first insulating layer overlapping the dummy member.

2. The display device of claim 1, wherein:
   the dummy member comprises a same material as the gate line, is substantially and simultaneously formed with the gate line, and is disposed on a same layer as the gate line.

3. The display device of claim 1, further comprising:
   a second insulating layer disposed on the first base substrate and covering the dummy member,
   wherein the first insulating layer is disposed on the second insulating layer, the first insulating layer disposed in the step difference area has a first step difference defined by a difference in height between the first height and the second height, and the first step difference corresponds to a thickness of the dummy member.

4. The display device of claim 3, wherein:
   left and right boundary areas of the first insulating layer in the step difference area have an inclined surface such that a width between the left and right boundary areas of the first insulating layer in the step difference area gradually narrows as a distance from the upper surface of the first insulating layer decreases.

5. The display device of claim 1, wherein:
   the dummy member comprises a same material as the data line, is substantially and simultaneously formed with the data line, and is disposed on a same layer as the data line.

6. The display device of claim 1, further comprising:
   a second insulating layer disposed on the first base substrate, wherein the dummy member is disposed on the second insulating layer, the first insulating layer is disposed on the second insulating layer and covers the dummy member, the first insulating layer disposed in the step difference area has a step difference defined by a difference in height between the first height and the second height, and the first step difference corresponds to a thickness of the dummy member.

7. The display device of claim 1, wherein the dummy member comprises:
a first dummy member comprising a same material as the gate line, wherein the first dummy member is substantially and simultaneously formed with the gate line and is disposed on a same layer as the gate line; and
a second dummy member comprising a same material as the data line, wherein the second dummy member has substantially a same size as the first dummy member, overlaps the first dummy member, is substantially and simultaneously formed with the data line, and is disposed on a same layer as the data line.

8. The display device of claim 7, further comprising:
a second insulating layer disposed on the first base substrate,
wherein the first dummy member is disposed on the first base substrate, the second insulating layer covers the first dummy member, the second dummy member is disposed on the second insulating layer, the first insulating layer is disposed on the second insulating layer and covers the second dummy member, the first insulating layer disposed in the step difference area has a step difference defined by a difference in height between the first height and the second height, and the step difference corresponds to a sum of a thickness of the first dummy member and a thickness of the second dummy member.

9. The display device of claim 1, wherein the data line comprises:
a first data line; and
a second data line,
wherein the transistor comprises:
a first transistor connected to the gate line and the first data line; and
a second transistor connected to the gate line and the second data line,
wherein the pixel electrode comprises:
a first pixel electrode connected to the first transistor; and
a second pixel electrode connected to the second transistor and spaced apart from the first pixel electrode by a predetermined distance in the second direction,
wherein the first and second transistors are disposed between the first pixel electrode and the second pixel electrode in the second direction.

10. The display device of claim 9, wherein:
a length of the dummy member in the first direction is smaller than a width between left and right sides of the first and second pixel electrodes in the first direction, and
a center portion of the dummy member in the first direction corresponds to a center portion of the first and second pixel electrodes in the first direction.

11. The display device of claim 9, wherein the first pixel electrode comprises:
a first trunk portion having a cross shape;
a plurality of first branch portions protruding and extending from the first trunk portion;
a first connection portion connecting the first trunk portion and the first branch portions in an upper boundary of the first pixel electrode; and
a first connection electrode branched from two first branch portions of the plurality of first branch portions disposed adjacent to a left side of a lower portion of the first trunk portion extending in the second direction,
wherein the first connection electrode extends to make an acute angle with the first direction, and is connected to the first transistor.

12. The display device of claim 11, wherein the acute angle between the first connection electrode and the first direction is in a range from about 30 degrees to about 60 degrees.

13. The display device of claim 9, wherein the second pixel electrode comprises:
a second trunk portion having a cross shape;
a plurality of second branch portions protruding and extending from the second trunk portion;
a second connection portion connecting the second trunk portion and the second branch portions in a lower boundary of the second pixel electrode;
a first extension portion branched from two second branch portions of the plurality of second branch portions adjacent to a right side of an upper portion of the second trunk portion extending in the second direction, and extending to make a first acute angle with the first direction;
a second extension portion connected to an upper portion of the first extension portion and extending upwardly;
a third extension portion connected to an upper portion of the second extension portion and extending to make an obtuse angle with the first direction;
a fourth extension portion connected to an upper portion of the third extension portion and extending upwardly; and
a fifth extension portion connected to an upper portion of the fourth extension portion, extending to make a second acute angle with the first direction, and connected to the second transistor,
wherein the second and third extension portions partially overlap the second transistor.

14. The display device of claim 13, wherein:
the first and second acute angles are each in a range from about 30 degrees to about 60 degrees, and the obtuse angle is in a range from about 120 degrees to about 150 degrees.

15. The display device of claim 9, wherein the dummy member comprises:
a first dummy member comprising a same material as the gate line, wherein the first dummy member is substantially and simultaneously formed with the gate line, and is disposed on a same layer as the gate line; and
a second dummy member comprising a same material as the data line, wherein the second dummy member is substantially and simultaneously formed with the data line, is disposed on a same layer as the data line, has a size smaller than a size of the first dummy member, and overlaps the first dummy member,
wherein a predetermined area of an upper portion of the first dummy member overlaps a predetermined area of a lower boundary of the second pixel electrode adjacent to the first dummy member in the second direction, and a predetermined area of a lower portion of the first dummy member overlaps a predetermined area of an upper boundary of the first pixel electrode.

16. The display device of claim 15, wherein the step difference area comprises:
- a first step difference area defined by an area of the first insulating layer in which the first and second dummy members do not overlap; and
- a second step difference area defined by an area of the first insulating layer in which the first and second dummy members overlap,
- wherein the second step difference area has a height larger than a height of the first insulating layer in the first step difference area, the first insulating layer disposed in the first step difference area has a first step difference defined by a difference in height between the first insulating layer in the first step difference area and the first insulating layer in the peripheral area, the first step difference corresponds to a thickness of the first dummy member, the first insulating layer disposed in the second step difference area has a second step difference defined by a difference in height between the first insulating layer in the second step difference area and the first insulating layer in the peripheral area, and the second step difference corresponds to a sum of a thickness of the first dummy member and a thickness of the second dummy member.

17. The display device of claim 16, wherein:
- left and right boundary areas of the first insulating layer in the first step difference area have a first inclined surface such that a width between the left and right boundary areas of the first insulating layer in the first step difference area becomes narrower as a distance from an upper surface of the first insulating layer decreases, and
- left and right boundary areas of the first insulating layer in the second step difference area have a second inclined surface such that a width between the left and right boundary areas of the first insulating layer in the second step difference area becomes narrower as a distance from an upper surface of the first insulating layer decreases.

18. The display device of claim 9, wherein the dummy members comprises:
- a first sub-dummy member extending in the first direction;
- a second sub-dummy member connected to a first side of the first sub-dummy member in the first direction; and
- a third sub-dummy member connected to a second side of the first sub-dummy member in the first direction,
- wherein a center portion of the first sub-dummy member corresponds to a center portion of the first and second pixel electrodes in the first direction, and the first and second sides of the first sub-dummy member oppose each other.

19. The display device of claim 18, wherein:
- a width of the second sub-dummy member in the second direction becomes larger as a distance from the first side of the first sub-dummy member increases,
- a width of the third sub-dummy member in the second direction becomes larger as a distance from the second side of the first sub-dummy member increases,
- the second and third sub-dummy members have a symmetrical shape relative to each other,
- a predetermined area of an upper portion of the second and third sub-dummy members overlaps a predetermined area of a lower boundary of the second pixel electrode adjacent to the second and third sub-dummy members in the second direction, and
- a predetermined area of a lower portion of the second and third sub-dummy members overlaps a predetermined area of an upper boundary of the first pixel electrode adjacent to the second and third sub-dummy members in the second direction.

20. The display device of claim 1, further comprising:
- a first substrate on which the gate line, the data line, the transistor, the dummy member, and the first insulating layer are disposed;
- a second substrate facing the first substrate; and
- a liquid crystal layer disposed between the first substrate and the second substrate,
- wherein the first insulating layer comprises a color filter.

* * * * *